(12) United States Patent
Kim et al.

(10) Patent No.: US 10,395,719 B2
(45) Date of Patent: Aug. 27, 2019

(54) MEMORY DEVICE DRIVING MATCHING LINES ACCORDING TO PRIORITY

(71) Applicant: SAMSUNG ELECTRONICS CO., LTD., Suwon-si, Gyeonggi-Do (KR)

(72) Inventors: Cheol Kim, Seoul (KR); Kee-Won Kwon, Suwon-si (KR); Ji-Su Min, Suwon-si (KR); Rak-Joo Sung, Suwon-si (KR); Sung-gi Ahn, Suwon-si (KR)

(73) Assignees: SAMSUNG ELECTRONICS CO., LTD., Suwon-si, Gyeonggi-Do (KR); RESEARCH & BUSINESS FOUNDATION SUNGKYUNKWAN UNIVERSITY, Suwon-si, Gyeonggi-Do (KR)

(*) Notice: Subject to any disclaimer, the term of this patent is extended or adjusted under 35 U.S.C. 154(b) by 0 days.

(21) Appl. No.: 16/005,880

(22) Filed: Jun. 12, 2018

(65) Prior Publication Data

US 2019/0130958 A1 May 2, 2019

(30) Foreign Application Priority Data

Oct. 27, 2017 (KR) .................... 10-2017-0141043

(51) Int. Cl.
  *G11C 11/22* (2006.01)
  *G11C 7/12* (2006.01)
  *G11C 5/06* (2006.01)
  *G11C 15/04* (2006.01)

(52) U.S. Cl.
  CPC .......... *G11C 11/2293* (2013.01); *G11C 5/063* (2013.01); *G11C 7/12* (2013.01); *G11C 15/04* (2013.01)

(58) Field of Classification Search
  CPC ....... G11C 11/2233; G11C 5/063; G11C 7/12; G11C 15/05
  USPC ............. 365/203, 49.1, 49.17, 49.18, 189.11
  See application file for complete search history.

(56) References Cited

U.S. PATENT DOCUMENTS

| | | | |
|---|---|---|---|
| 6,760,241 B1* | 7/2004 | Gharia | G11C 15/043 365/189.07 |
| 7,675,765 B2 | 3/2010 | Derharcobian et al. | |
| 7,852,652 B1* | 12/2010 | Fabry | G11C 15/04 365/203 |
| 8,891,272 B2 | 11/2014 | Wada | |
| 9,299,436 B2 | 3/2016 | Sakimura et al. | |
| 9,520,194 B2 | 12/2016 | Iyengar | |
| 9,548,120 B2 | 1/2017 | Roohparvar | |
| 9,564,183 B2 | 2/2017 | Barth, Jr. | |
| 9,620,214 B2 | 4/2017 | Watanabe et al. | |

(Continued)

FOREIGN PATENT DOCUMENTS

KR 1020130105393 9/2013

*Primary Examiner* — Tan T. Nguyen
(74) *Attorney, Agent, or Firm* — F. Chau & Associates, LLC

(57) ABSTRACT

A memory device includes a storage circuit, a first driving circuit, and a second driving circuit. The storage circuit stores first data and compares the first data and second data. The first driving circuit selectively drives a matching line to a first logic state, depending on a comparison result of the first data and the second data by the storage circuit. The second driving circuit drives the matching line to a second logic state regardless of the comparison result.

20 Claims, 11 Drawing Sheets

(56) References Cited

U.S. PATENT DOCUMENTS

| 2010/0054011 A1* | 3/2010 | Kim ..................... G11C 7/1048 |
| | | 365/49.17 |
| 2011/0026288 A1* | 2/2011 | Watanabe .............. G11C 15/00 |
| | | 365/49.17 |
| 2015/0235701 A1* | 8/2015 | Iyengar .................. G11C 15/00 |
| | | 365/49.17 |

* cited by examiner

MEMORY DEVICE DRIVING MATCHING LINES ACCORDING TO PRIORITY

CROSS-REFERENCE TO RELATED APPLICATION

This U.S. non-provisional patent application claims priority under 35 U.S.C. § 119 to Korean Patent Application No. 10-2017-0141043, filed on Oct. 27, 2017 in the Korean Intellectual Property Office, the disclosure of which is incorporated by reference herein in its entirety.

TECHNICAL FIELD

Exemplary embodiments of the inventive concept relate to a memory device, and in particular, to a memory device that drives matching lines depending on priorities.

DISCUSSION OF RELATED ART

A content addressable memory (CAM) device may receive data and may search for an address corresponding to the received data. A memory cell of the CAM device may perform a comparison operation. For example, the CAM device may be used to search for an IP address in a network router in this manner.

A ternary CAM (TCAM) device may perform a function that is similar to the CAM device. Compared with the CAM device, the TCAM device may further store a don't care bit in addition to a logic "0" bit and a logic "1" bit. In a search operation, a memory cell where the don't care bit is stored may always output a matching result.

Since the TCAM device stores the don't care bit, a plurality of memory cells may output matching results in the search operation. A conventional TCAM device may include a priority encoder for distinguishing between matching results. However, capacity, area, speed, and power consumption of the TCAM device may be limited by the priority encoder.

SUMMARY

According to an exemplary embodiment of the inventive concept, a memory device may include a storage circuit, a first driving circuit, and a second driving circuit. The storage circuit may store first data and may compare the first data and second data. The first driving circuit may selectively drive a matching line to a first logic state, depending on a comparison result of the first data and the second data by the storage circuit. The second driving circuit may drive the matching line to a second logic state regardless of the comparison result.

According to an exemplary embodiment of the inventive concept, a memory device may include a first memory cell, a second memory cell, a sense amplifier array, and an encoder. The first memory cell may store first data and may drive a first matching line depending on a first comparison result of the first data and third data. The second memory cell may store second data and may drive a second matching line depending on a second comparison result of the second data and the third data. The sense amplifier array may amplify a voltage of the first matching line to output a first amplified voltage and may amplify a voltage of the second matching line to output a second amplified voltage. The encoder may output one of addresses of the first and second matching lines depending on a first transition time of the first amplified voltage or a second transition time of the second amplified voltage.

According to an exemplary embodiment of the inventive concept, a memory device may include a plurality of memory cells and a precharge circuit. The plurality of memory cells may store first data and may selectively drive a matching line to a first logic state, depending on a comparison result of the first data and second data. The precharge circuit may drive the matching line to a second logic state regardless of the comparison result. Each of the plurality of memory cells and the precharge circuit may be connected to the matching line.

BRIEF DESCRIPTION OF THE FIGURES

The above and other objects and features of the inventive concept will become apparent by describing in detail exemplary embodiments thereof with reference to the accompanying drawings.

DETAILED DESCRIPTION OF THE EMBODIMENTS

Figure 1:
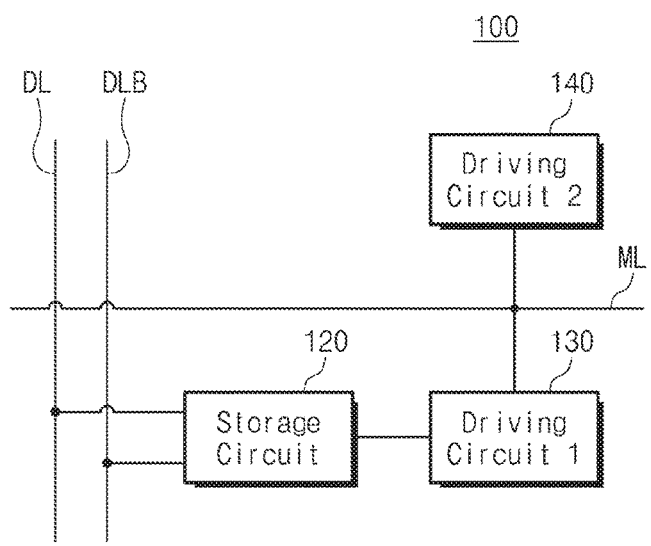
FIG. 1 is a block diagram illustrating a memory device according to an exemplary embodiment of the inventive concept.

Exemplary embodiments of the inventive concept provide a memory device that drives matching lines depending on priorities.

Exemplary embodiments of the inventive concept will be described in detail hereinafter with reference to the accompanying drawings. Like reference numerals may refer to like elements throughout this application.

FIG. 1 is a block diagram illustrating a memory device according to an exemplary embodiment of the inventive concept. For example, a memory device 100 may be a content addressable memory (CAM) device or a ternary content addressable memory (TCAM) device. Referring to FIG. 1, the memory device 100 may include a storage circuit 120, a first driving circuit 130, and a second driving circuit 140.

The storage circuit 120 may receive data through a data line pair DL and DLB and may store the data. The data stored in the storage circuit 120 may be write data or program data that an external device (e.g., a host to control the memory device 100) provides to the memory device 100. Below, the data stored in the storage circuit 120 is referred to as "first data". The memory device 100 may include a plurality of storage circuits. For brevity of illustration, only one storage circuit 120 is illustrated in FIG. 1. In FIG. 1, the first data may be 1-bit data. For example, the first data may be any one of a logical "0" bit, a logical "1" bit, or a don't care bit.

The storage circuit 120 may receive search data through the data line pair DL and DLB. The storage circuit 120 may compare the first data and the search data, and may provide the comparison result to the first driving circuit 130. The search data are not data stored in the storage circuit 120 but data provided to search for the first data. Below, the search data are referred to as "second data".

The first driving circuit 130 may drive a matching line ML to a first logic state or may not drive the matching line ML, depending on the comparison result. That is, the first driving circuit 130 may selectively drive the matching line ML to the first logic state, depending on the comparison result. The first logic state may correspond to one of logic "0" or logic "1". In detail, if the first data do not correspond to the don't care bit and is matched with the second data, the first driving circuit 130 may not drive the matching line ML. If the first data correspond to the don't care bit, the first driving circuit 130 may weakly drive the matching line ML to the first logic state. If the first data are mismatched with the second data, the first driving circuit 130 may strongly drive the matching line ML to the first logic state.

The second driving circuit 140 may drive the matching line ML to a second logic state regardless of the comparison result. The second logic state may correspond to one of logic "0" or logic "1", and, if the first logic state corresponds to logic "0", the second logic state may correspond to logic "1". The second driving circuit 140 may drive the matching line ML in a direction that is opposite to a driving direction of the first driving circuit 130. The second driving circuit 140 may be referred to as a "precharge circuit".

The data line pair DL and DLB may include a data line DL and a complementary data line DLB. The data line pair DL and DLB may be a path configured such that a voltage or a current corresponding to the first data and a voltage or a current corresponding to the second data are provided to the storage circuit 120.

The matching line ML may be driven by the first driving circuit 130 or the second driving circuit 140. The matching line ML may be a path configured such that there is output information about whether the first data are matched with the second data, whether the first data correspond to the don't care bit, or whether the first data are mismatched with the second data.

Figure 2:
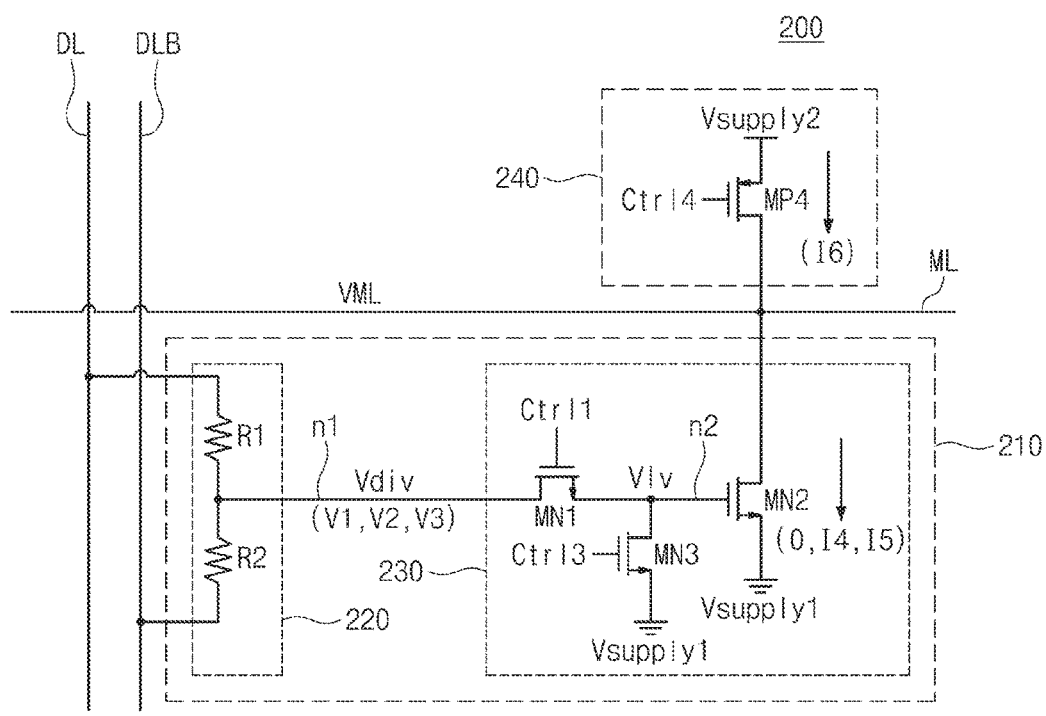
FIG. 2 is a block diagram illustrating the memory device of FIG. 1 in detail according to an exemplary embodiment of the inventive concept.

FIG. 2 is a block diagram illustrating the memory device of FIG. 1 in detail according to an exemplary embodiment of the inventive concept. Referring to FIG. 2, a memory device 200 may include a memory cell 210 and a second driving circuit 240, and the memory cell 210 may include a storage circuit 220 and a first driving circuit 230. Here, the storage circuit 220, the first driving circuit 230, and the second driving circuit 240 may be substantially the same as the storage circuit 120, the first driving circuit 130, and the second driving circuit 140, respectively. The storage circuit 220 and the first driving circuit 230 may constitute the memory cell 210.

The storage circuit 220 may include at least one resistive memory element that is programmed according to the first data. The resistive memory element may be a memory element that is used in a phase-change random access memory (PRAM), a magnetic random access memory (MRAM), a resistive random access memory (RRAM), or the like. A resistance value of the resistive memory cell may be changed according to a voltage or a current applied from the outside.

The storage circuit 220 may include a first resistor R1 and a second resistor R2. The first resistor R1 may be disposed between the data line DL and a first node n1, and the second resistor R2 may be disposed between the complementary data line DLB and the first node n1. The first resistor R1 and the second resistor R2 may be connected in series to each other.

The first driving circuit 230 may include a first transistor MN1, a second transistor MN2, and a third transistor MN3. The first transistor MN1 may electrically connect the first node n1 and a second node n2 in response to a first control signal Ctrl1 for receiving an output voltage or an output current of the storage circuit 220. The second transistor MN2 may electrically connect the matching line ML and a first supply voltage Vsupply1 in response to an output of the first transistor MN1. The third transistor MN3 may electrically connect the second node n2 and the first supply voltage Vsupply1 in response to a third control signal Ctrl3. For example, the first supply voltage Vsupply1 may correspond to one of the first logic state and the second logic state.

The second driving circuit 240 may include a fourth transistor MP4. The fourth transistor MP4 may electrically connect a second supply voltage Vsupply2 and the matching line ML in response to a fourth control signal Ctrl4. For example, the second supply voltage Vsupply2 may correspond to one of the first logic state and the second logic state.

An example is illustrated in FIG. 2 where each of the first transistor MN1, the second transistor MN2, and the third transistor MN3 is an n-channel metal oxide semiconductor (NMOS) transistor and the fourth transistor MP4 is a p-channel metal oxide semiconductor (PMOS) transistor. Types of the illustrated transistors are only exemplary. For example, types of the transistors MN1, MN2, MN3, and MP4 may be determined according to a voltage corresponding to the first logic state, a voltage corresponding to the second logic state, the operating speed and area of the memory cell 210, or the like. Additionally, each of the transistors MN1, MN2, MN3, and MP4 may be implemented with a switch in which an NMOS transistor and a PMOS transistor are connected in parallel.

It is assumed here that the first supply voltage Vsupply1 corresponds to the first logic state and the second supply voltage Vsupply2 corresponds to the second logic state. Below, a program operation (or a write operation) and a search operation of the memory device 200 will be described in order.

In the program operation, the first resistor R1 may be programmed to a high resistance state HRS or a low resistance state LRS by a current passing through the data line DL, the first resistor R1, the first transistor MN1, and the third transistor MN3 (or a current passing through in an opposite direction). In this case, the complementary data line DLB may be in a floating state. Similar to the above description, the second resistor R2 may be programmed to the high resistance state HRS or the low resistance state LRS by a current passing through the complementary data line DLB, the second resistor R2, the first transistor MN1, and the third transistor MN3 (or a current passing through in an opposite direction). In this case, the data line DL may be in a floating state. A resistance value of the high resistance state HRS may be greater than a resistance value of the low resistance state LRS.

For example, if the first resistor R1 is programmed to the low resistance state LRS and the second resistor R2 is programmed to the high resistance state HRS, the first data corresponding to a logical "0" bit may be stored in the storage circuit 220. For example, if the first resistor R1 is programmed to the high resistance state HRS and the second resistor R2 is programmed to the low resistance state LRS, the first data corresponding to a logical "1" bit may be stored in the storage circuit 220. If both the first resistor R1 and the second resistor R2 are programmed to the high resistance state HRS, the first data corresponding to a don't care bit may be stored in the storage circuit 220. However, a relationship between the resistance states and the logical "0" bit, the logical "1" bit, and the don't care bit are only exemplary.

In the search operation, the storage circuit 220 may receive the second data through the data line pair DL and DLB. Voltages corresponding to the second data may be applied to the first resistor R1 and the second resistor R2 through the data line pair DL and DLB. The first resistor R1 and the second resistor R2 may operate as a voltage divider. The first resistor R1 and the second resistor R2 may divide a voltage difference between the voltages corresponding to the second data and may output a voltage Vdiv to the first node n1.

TABLE 1

| | | Data 2 = "0", DL = "0", DLB = "1" | | |
|---|---|---|---|---|
| Case | Data 1 | R1/R2 | Vdiv, Vlv | MN2 | ML |
| 1 | 0 | LRS/HRS | V1 | Off | Second logic state (fast) |
| 2 | X | HRS/HRS | V2 | Weak On | Second logic state (slow) |
| 3 | 1 | HRS/LRS | V3 | On | First logic state |

Table 1 is associated with cases where the second data correspond to the logical "0" bit and the first data correspond to the logical "0" bit, the don't care bit, or the logical "1" bit. If the second data correspond to the logical "0" bit, the data line DL may be driven to the first logic state and the complementary data line DLB may be driven to the second logic state. In Table 1, it is assumed that the first transistor MN1 is turned on, and thus, the first node n1 and the second node n2 are electrically connected. Accordingly, the voltage Vdiv is the same as a voltage Vlv.

In a first case, the first data correspond to the logical "0" bit and the second data correspond to the logical "0" bit. Accordingly, the first case may indicate a case where the first data do not correspond to the don't care bit and is matched with the second data. In the first case, the storage circuit 220 may output a first voltage V1 or a first current corresponding to the first voltage V1 to the first node n1. The first voltage V1 may be applied to the second transistor MN2, and the second transistor MN2 may be turned off by the first voltage V1. The first driving circuit 230 does not drive the matching line ML, and the second driving circuit 240 drives the matching line ML with a sixth current I6 (or supplies the sixth current I6 to the matching line ML). Since the first driving circuit 230 does not drive the matching line ML to the first logic state, the matching line ML may be quickly driven to the second logic state.

In a second case, the first data correspond to the don't care bit. In the second case, the storage circuit 220 may output a second voltage V2 or a second current corresponding to the second voltage V2 to the first node n1. The second voltage V2 may be applied to the second transistor MN2, and the second transistor MN2 may be turned on by the second voltage V2.

In the second case, since the first data correspond to the don't care bit, the matching line ML of the second case may be driven to the second logic state, like the matching line ML of the first case. Here, the memory device 200 should distinguish between the first case where the first data are matched with the second data and the second case where the first data correspond to the don't care bit.

According to an exemplary embodiment of the inventive concept, a speed at which the matching line ML is driven to the second logic state in the first case is faster than a speed at which the matching line ML is driven to the second logic state in the second case. In detail, the first driving circuit 230 does not operate in the first case, while the first driving circuit 230 may drive the matching line ML with a fourth current I4 in the second case. Accordingly, the matching line ML may be driven to the second logic state more slowly than the first case where the matching line ML is driven only by the second driving circuit 240. As such, the second transistor MN2 may be weakly turned on.

In a third case, the first data correspond to the logical "1" bit and the second data correspond to the logical "0" bit. Accordingly, the third case may indicate a case where the first data are mismatched with the second data. In the third case, the storage circuit 220 may output a third voltage V3 or a third current corresponding to the third voltage V3 to the first node n1. The third voltage V3 may be applied to the second transistor MN2, and the second transistor MN2 may be turned on by the third voltage V3.

Since the first data are mismatched with the second data in the third case, the matching line ML may be maintained at the first logic state or may be driven to the first logic state. The first driving circuit 230 may drive the matching line ML with a fifth current I5, and the second driving circuit 240 may drive the matching line ML with the sixth current I6 (or may supply the sixth current I6 to the matching line ML). Accordingly, the matching line ML may be maintained at the first logic state or may be driven to the first logic state. In the third case, the second transistor MN2 may be turned on more strongly than in the second case, and the fifth current I5 may be greater than the fourth current I4 of the second case.

TABLE 2

| | | Data 2 = "1", DL = "1", DLB = "0" | | |
|---|---|---|---|---|
| Case | Data 1 | R1/R2 | Vdiv, Vlv | MN2 | ML |
| 3 | 0 | LRS/HRS | V3 | On | First logic state |
| 2 | X | HRS/HRS | V2 | Weak On | Second logic state (slow) |
| 1 | 1 | HRS/LRS | V1 | Off | Second logic state (fast) |

Table 2 is associated with cases where the second data correspond to the logical "1" bit and the first data correspond to the logical "0" bit, the don't care bit, or the logical "1" bit. If the second data correspond to the logical "1" bit, the data line DL may be driven to the second logic state and the complementary data line DLB may be driven to the first logic state. Although the second data are changed, as in Table 1, the first case indicates a case where the first data do not correspond to the don't care bit and are matched with the second data, the second case indicates a case where the first data correspond to the don't care bit, and the third case indicate a case where the first data are mismatched with the second data. Accordingly, in Table 1 and Table 2, the voltages Vdiv and Vlv, a state of the second transistor MN2, and a logic state of the matching line ML are not changed in the first to third cases.

Figure 3:
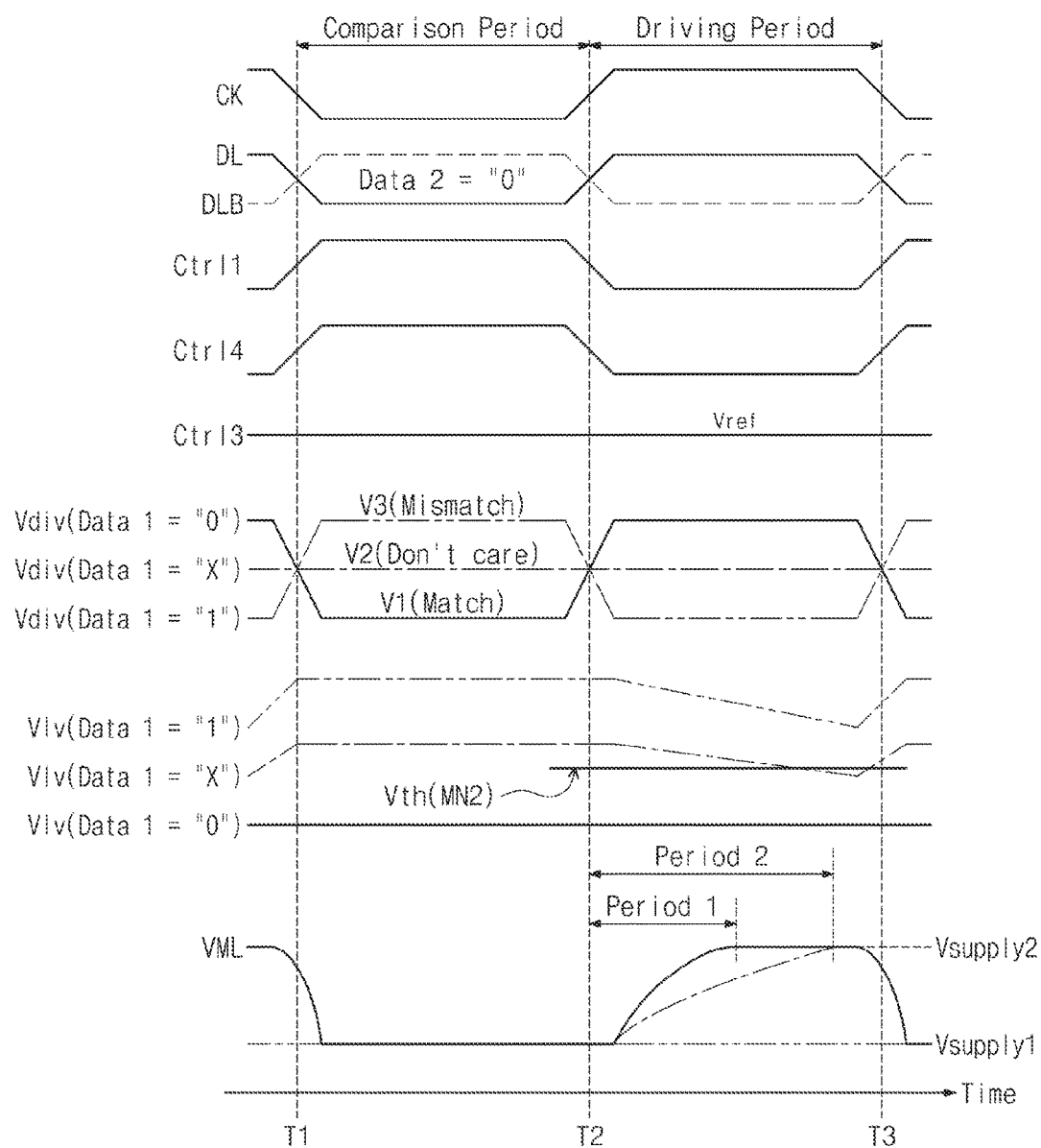
FIG. 3 is a timing diagram illustrating an operation of the memory device of FIG. 2 according to an exemplary embodiment of the inventive concept.

FIG. 3 is a timing diagram illustrating an operation of a memory device of FIG. 2 according to an exemplary embodiment of the inventive concept. FIG. 3 will be described with reference to FIG. 2, Table 1, and Table 2. In FIG. 3, it is assumed that the second data correspond the logical "0" bit.

A period from a time T1 to a time T2 may be a comparison period. A period from a time T2 to a time T3 may be a driving period. The comparison period T1 to T2 and the driving period T2 to T3 may be distinguished according to a logic state of a clock CK. For example, the clock CK may be in the first logic state in the comparison period T1 to T2 and may be in the second logic state in the driving period T2 to T3.

In the comparison period T1 to T2, a voltage of the data line DL and a voltage of the complementary data line DLB may be a voltage and an inverse voltage of the second data corresponding to the logical "0" bit, the first control signal Ctrl1 and the fourth control signal Ctrl4 may correspond to the second logic state, and the third control signal Ctrl3 may correspond to a reference voltage Vref.

Since the first transistor MN1 is turned on according to the first control signal Ctrl1, the voltage Vdiv and the voltage Vlv may be substantially the same. The voltage Vdiv may be an input of the first transistor MN1, and the voltage Vlv may be an output of the first transistor MN1.

In the first case (a solid line) where the first data are matched with the second data, the voltage Vdiv may be the first voltage V1 by the storage circuit 220. In the second case (an alternated long and short dash line) where the first data correspond to the don't care bit, the voltage Vdiv may be the second voltage V2 by the storage circuit 220. In the third case (an alternated long and two short dashes line) where the first data are mismatched with the second data, the voltage Vdiv may be the third voltage V3 by the storage circuit 220.

Referring to FIG. 3, the first voltage V1 may be lower than the second and third voltages V2 and V3, the second voltage V2 may be lower than the third voltage V3, and the third voltage V3 may be higher than the first and second voltages V1 and V2. However, a relationship between the first to third voltages V1 to V3 is not limited to the above description. For example, a relationship between the first to third voltages V1 to V3 may be changed according to a program state of the first and second resistors R1 and R2 and voltages of the data line DL and the complementary data line DLB.

In the comparison period T1 to T2, a voltage VML of the matching line ML may be set to the first supply voltage Vsupply1 corresponding to the first logic state. To this end, the memory device 200 may further include a third driving circuit that drives the matching line ML to the first logic state during the comparison period T1 to T2.

In the driving period T2 to T3, voltages of the data line DL and the complementary data line DLB may be changed according to a phase change of the clock CK. However, the inventive concept is not limited thereto, and voltages of the data line DL and the complementary data line DLB may not be changed. The first control signal Ctrl1 and the fourth control signal Ctrl4 may correspond to the first logic state, and the third control signal Ctrl3 may still correspond to the reference voltage Vref.

Since the first transistor MN1 is turned off according to the first control signal Ctrl1, the voltage Vdiv and the voltage Vlv may be different from each other. The fourth transistor MP4 may be turned on according to the fourth control signal Ctrl4. In other words, the fourth transistor MP4 may drive the matching line ML with the sixth current I6 regardless of the voltage Vlv (or regardless of a comparison result of the storage circuit 220).

In the first case, the voltage Vlv may be the first voltage V1 and may be lower than a threshold voltage Vth of the second transistor MN2. The second transistor MN2 may be turned off by the voltage Vlv. If the first transistor MN1 receives the first voltage Vlv, the second transistor MN2 may be turned off. For example, a current of the second transistor MN2 may be "0". The matching line ML may be driven from the first logic state to the second logic state by the fourth transistor MN4 during a first period (Period 1). In other words, the voltage VML of the matching line ML may change from the first supply voltage Vsupply1 to the second supply voltage Vsupply2 during the first period.

In the second case, the voltage Vlv may be the second voltage V2 and may be slightly higher than the threshold voltage Vth of the second transistor MN2. The second transistor MN2 may be weakly turned on by the voltage Vlv. If the first transistor MN1 receives the second voltage V2, the second transistor MN2 may be weakly turned on.

The second transistor MN2 may drive the matching line ML with the fourth current I4, and the fourth transistor MP4 may drive the matching line ML with the sixth current I6. The matching line ML may be driven from the first logic state to the second logic state during a second period (Period 2). In other words, the voltage VML of the matching line ML may change from the first supply voltage Vsupply1 to the second supply voltage Vsupply2 during the second period. Unlike the first case, since the second transistor MN2 is weakly turned on, the second period may be longer than the first period.

In an exemplary embodiment of the inventive concept, the voltage Vlv may be maintained at the second voltage V2, unlike what is illustrated in FIG. 3. In this case, in the driving period T2 to T3, the third transistor MN3 may be turned off, and the third control signal Ctrl3 may correspond to the first logic state.

In an exemplary embodiment of the inventive concept, the voltage Vlv may slowly decrease from the second voltage V2 by the third transistor MN3, and the second transistor MN2 may be turned off. The third transistor MN3 may adjust the fourth current I4 of the second transistor MN2. In detail, the third transistor MN3 may prevent a logic state of the matching line ML from being abnormal due to an excessive increase in the fourth current I4 arising from process, voltage, and temperature variations. The reference voltage Vref may be continuously applied to a gate of the third transistor MN3 for reducing the fourth current I4.

In the third case, the voltage Vlv may be the third voltage V3 and may be higher than the second voltage V2 and the threshold voltage Vth of the second transistor MN2. The second transistor MN2 may be strongly turned on by the voltage V1v. If the first transistor MN1 receives the third voltage V3, the second transistor MN2 may be strongly turned on.

The second transistor MN2 may drive the matching line ML with the fifth current I5, and the fourth transistor MP4 may drive the matching line ML with the sixth current I6. During the driving period T2 to T3, the matching line ML may be maintained at the first logic state or may be driven to the first logic state. In other words, the voltage VML of the matching line ML may be maintained at the first supply voltage Vsupply1 during the driving period T2 to T3.

In FIG. 3, the voltage V1v may slowly decrease through the third transistor MN3. Even though the voltage V1v decreases, the matching line ML may be maintained at the first logic state or may be driven to the first logic state during the driving period T2 to T3.

Figure 4:
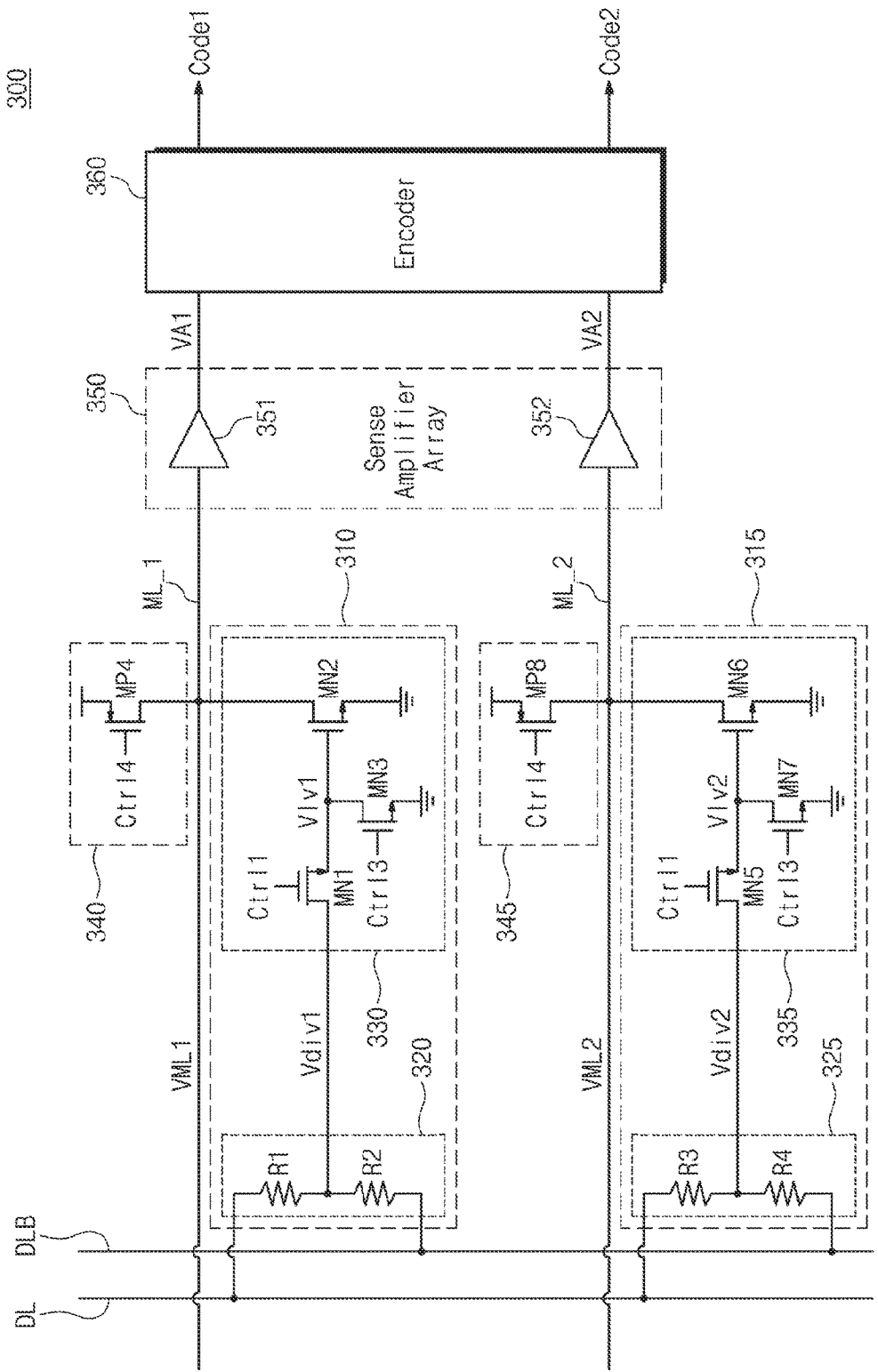
FIG. 4 is a block diagram illustrating a memory device according to an exemplary embodiment of the inventive concept.

FIG. 4 is a block diagram illustrating a memory device according to an exemplary embodiment of the inventive concept. Referring to FIG. 4, a memory device 300 may include a first memory cell 310, a second memory cell 315, a first precharge circuit 340, a second precharge circuit 345, a sense amplifier array 350, and an encoder 360.

The first memory cell 310 may include a first storage circuit 320 and a first driving circuit 330, and the second memory cell 315 may include a second storage circuit 325 and a second driving circuit 335. The first storage circuit 320 may include the first resistor R1 and the second resistor R2, and the second storage circuit 325 may include a third resistor R3 and a fourth resistor R4. The first driving circuit 330 may include the first transistor MN1, the second transistor MN2, and the third transistor MN3, and the second driving circuit 335 may include a fifth transistor MN5, a sixth transistor MN6, and a seventh transistor MN7.

Each of the first memory cell 310 and the second memory cell 315 may be implemented to be substantially the same as the memory cell 210 of FIG. 2, and operations of the first memory cell 310 and the second memory cell 315 may be substantially the same as the operation of the memory cell 210 of FIG. 2. The first and third control signals Ctrl1 and Ctrl3 may be applied to the fifth and seventh transistors MN5 and MN7, respectively.

In an exemplary embodiment of the inventive concept, data (hereinafter referred to as "first data") stored in the first memory cell 310 may be different from or the same as data (hereinafter referred to as "second data") stored in the second memory cell 315. Here, unlike in FIGS. 2 and 3, the second data may not refer to search data. Even though the first memory cell 310 and the second memory cell 315 are implemented similarly, the first data and the second data may be different. The first data and the second data may be provided to the first memory cell 310 and the second memory cell 315 through the data line pair DL and DLB.

Each of the first precharge circuit 340 and the second precharge circuit 345 may be implemented to be substantially the same as the second driving circuit 240 of FIG. 2, and operations of the first precharge circuit 340 and the second precharge circuit 345 may be substantially the same as the operation of the second driving circuit 240 of FIG. 2. The first precharge circuit 340 may drive a first matching line ML_1, and the second precharge circuit 345 may drive a second matching line ML_2. The first memory cell 310 and the second memory cell 315 share the data line pair DL and DLB but do not share a matching line.

The memory device 300 may receive search data (hereinafter referred to as "third data") for a search operation. The memory device 300 may determine whether any data of the first data and the second data are matched with the third data. To this end, the first memory cell 310 may drive the first matching line ML_1 depending on a first comparison result of the first data and the third data. Similar to the above description, the second memory cell 315 may drive the second matching line ML_2 depending on a second comparison result of the second data and the third data. As described with reference to FIG. 2, the first precharge circuit 340 may drive the first matching line ML_1 regardless of the first comparison result, and the second precharge circuit 345 may drive the second matching line ML_2 regardless of the second comparison result.

The sense amplifier array 350 may include a first sense amplifier 351 and a second sense amplifier 352. The first sense amplifier 351 may amplify a voltage VML1 of the first matching line ML_1 to output a first amplified voltage VA1, and the second sense amplifier 352 may amplify a voltage VML2 of the second matching line ML_2 to output a second amplified voltage VA2.

In detail, if the first data do not correspond to the don't care bit and are matched with the third data (the first case) or if the first data correspond to the don't care bit (the second case), the first sense amplifier 351 and the first precharge circuit 340 may change a logic state of the first amplified voltage VA1 at a first transition time. If the first data are mismatched with the third data (the third case), the first sense amplifier 351 and the first precharge circuit 340 may not change a logic state of the first amplified voltage VA1.

Similar to the above description, if the second data do not correspond to the don't care bit and are matched with the third data (the first case) or if the second data correspond to the don't care bit (the second case), the second sense amplifier 352 and the second precharge circuit 345 may change a logic state of the second amplified voltage VA2 at a second transition time. If the second data are mismatched with the third data (the third case), the second sense amplifier 352 and the second precharge circuit 345 may not change a logic state of the second amplified voltage VA2.

The encoder 360 may output one of addresses of the first and second matching lines ML_1 and ML_2 depending on the first transition time of the first amplified voltage VA1 or the second transition time of the second amplified voltage VA2. The encoder 360 may generate a first code Code1 and a second code Code2 as an output. According to an exemplary embodiment of the inventive concept, the encoder 360 may not include an additional circuit for distinguishing between the first case where stored data are matched with search data and the second case where stored data correspond to the don't care bit. Accordingly, the area, power consumption, and operating time of the encoder 360 may decrease.

In the case where the first data are matched with the third data (the first case) and the second data are mismatched with the third data (the third case), the logic state of the first amplified voltage VA1 may change at the first transition time, while the logic state of the second amplified voltage VA2 may not change. In other words, the second transition time may not exist. In this case, the encoder 360 may output an address of the first matching line ML_1 depending on the first transition time.

In the case where the first data are matched with the third data (the first case) and the second data correspond to the don't care bit (the second case), the logic state of the first amplified voltage VA1 may change at the first transition time, and the logic state of the second amplified voltage VA2 may change at the second transition time. All the logic states of the first and second amplified voltages VA1 and VA2 may be changed, but according to an exemplary embodiment of the inventive concept, the first transition time and the second transition time may be different. For example, the first transition time may precede the second transition time. In this case, the encoder 360 may output an address of the first matching line ML_1 depending on the first transition time, and a change in the logic state of the second amplified voltage VA2 may be ignorable.

Figure 5:
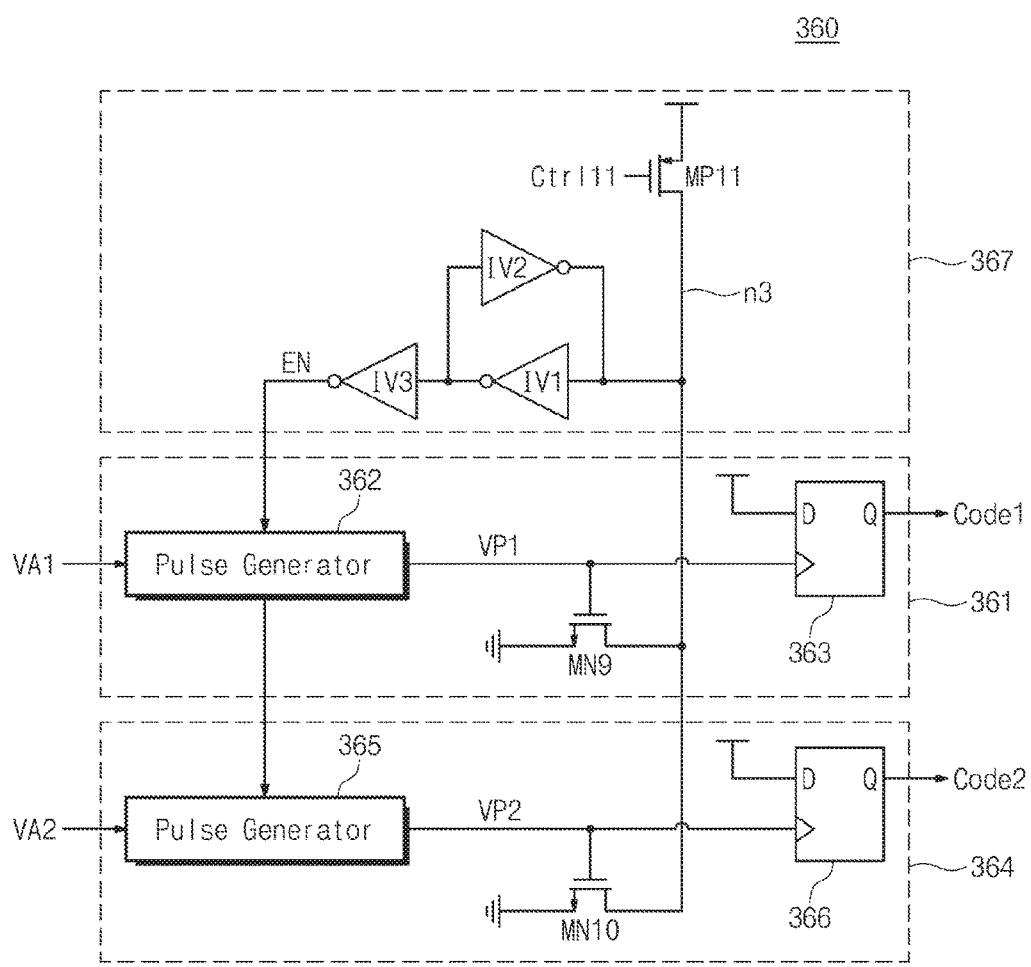
FIG. 5 is a block diagram illustrating an encoder of FIG. 4 in detail according to an exemplary embodiment of the inventive concept.

FIG. 5 is a block diagram illustrating an encoder of FIG. 4 in detail according to an exemplary embodiment of the inventive concept. Referring to FIG. 5, the encoder 360 may include a first sub encoder 361, a second sub encoder 364, and an enable signal generator 367.

The first sub encoder 361 may include a first pulse generator 362, a ninth transistor MN9, and a first flip-flop 363. The first pulse generator 362 may generate a first pulse VP1 based on a change in a logic state of the first amplified voltage VA1. The first pulse VP1 may operate the first flip-flop 363, and the first flip-flop 363 may generate the first code Code1 corresponding to the second logic state. The ninth transistor MN9 may drive a third node n3 to the first logic state in response to the first pulse VP1. The enable signal generator 367 may deactivate an enable signal EN based on a change in a logic state of the third node n3.

The second sub encoder 364 may include a second pulse generator 365, a tenth transistor MN10, and a second flip-flop 366. The second sub encoder 364 may be implemented to be substantially the same as the first sub encoder 361. However, if a logic state of the second amplified voltage VA2 does not change, the second pulse generator 365 cannot generate the second pulse VP2. In the case where the second transition time of the second amplified voltage VA2 lags behind the first transition time of the first amplified voltage VA1, the second pulse generator 365 cannot generate the second pulse VP2 by the enable signal EN being deactivated.

The enable signal generator 367 may include first to third inverters IV1 to IV3 and an eleventh transistor MP11. The eleventh transistor MP11 may drive the third node n3 to the second logic state in response to an eleventh control signal Ctrl11. If the third node n3 is driven to the second logic state, the eleventh transistor MP11 may not drive the third node n3 any more in response to the eleventh control signal Ctrl11. In other words, the eleventh transistor MP11 may be turned off by the eleventh control signal Ctrl11.

The first and second inverters IV1 and IV2 may operate as a latch. The first and second inverters IV1 and IV2 may maintain a voltage of the third node n3 driven to the second logic state. Afterwards, if the third node n3 is driven to the first logic state by one of the ninth transistor MN9 or the tenth transistor MN10, the first and second inverters IV1 and IV2 may maintain a voltage of the third node n3 driven to the first logic state. The third inverter IV3 may output the enable signal EN to the first and second pulse generators 362 and 365. If the enable signal EN corresponds to the first logic state, the first and second pulse generators 362 and 365 may not operate; if the enable signal EN corresponds to the second logic state, the first and second pulse generators 362 and 365 may operate.

In FIG. 5, types of the transistors MN9, MN10, and MP11 and the number of inverters IV1 to IV3 are only exemplary. The encoder 360 may be configured to operate only one of the first and second sub encoders 361 and 364 depending on the first transition time of the first amplified voltage VA1 or the second transition time of the second amplified voltage VA2.

Figure 6:
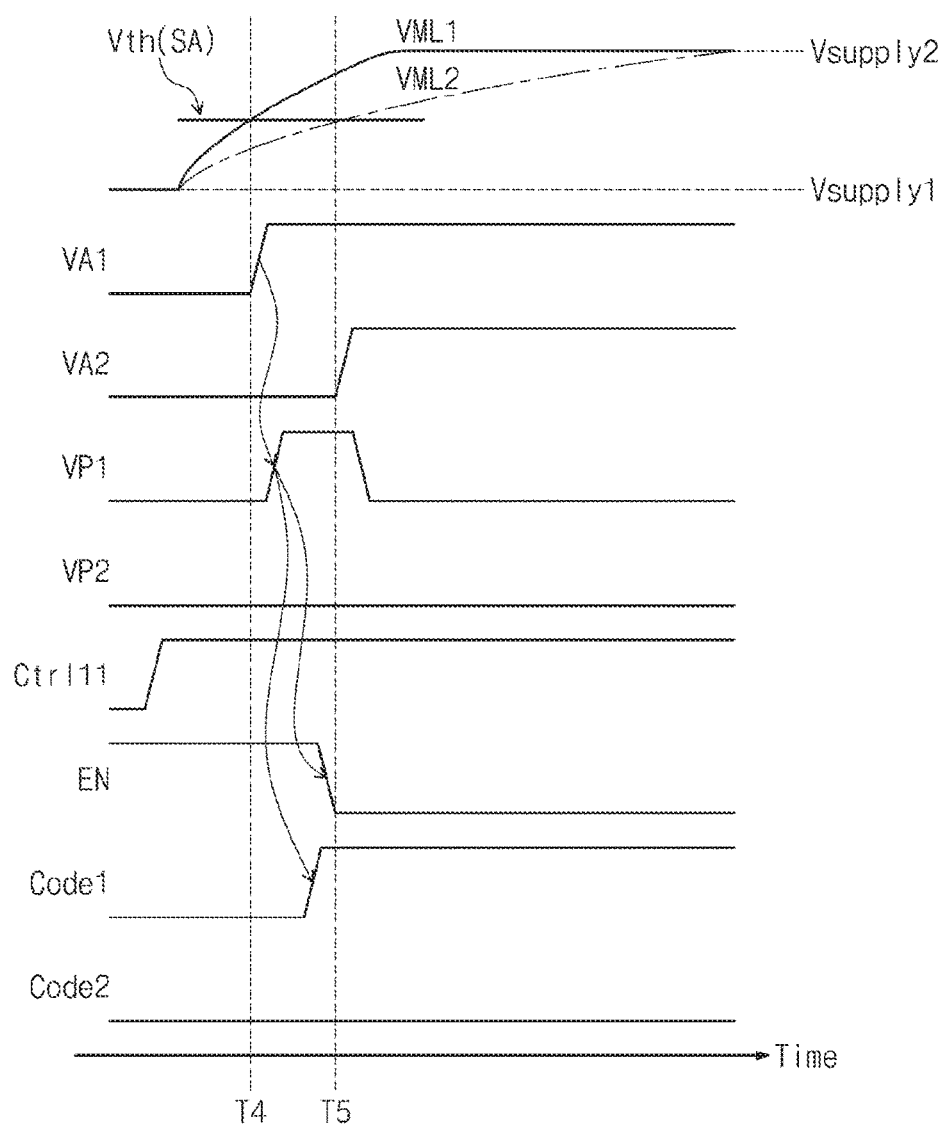
FIG. 6 is a timing diagram illustrating an operation of the memory device of FIG. 4 according to an exemplary embodiment of the inventive concept.

FIG. 6 is a timing diagram illustrating an operation of the memory device of FIG. 4 according to an exemplary embodiment of the inventive concept. FIG. 6 will be described with reference to FIGS. 3, 4, and 5, and Tables 1 and 2. In FIG. 6, it is assumed that the first data do not correspond to the don't care bit and are matched with the third data (the first case) and the second data correspond to the don't care bit (the second case).

Similar to the voltage VML (a solid line) of the matching line ML in the driving period T2 to T3 of FIG. 3, the voltage VML1 of the first matching line ML1 may change from the first supply voltage Vsupply1 to the second supply voltage Vsupply2. Additionally, similar to the voltage VML (an alternated long and short dash line) of the matching line ML in the driving period T2 to T3 of FIG. 3, the voltage VML2 of the second matching line ML2 may change from the first supply voltage Vsupply1 to the second supply voltage Vsupply2.

At a first transition time T4, the voltage VML1 of the first matching line ML1 may reach a threshold voltage Vth(SA) of the first sense amplifier 351. A logic state of the first amplified voltage VA1 may be changed at the first transition time T4. Afterwards, the first pulse VP1 may be generated by the first pulse generator 362.

The eleventh control signal Ctrl11 may change from the first logic state to the second logic state. The enable signal EN may be set in advance to the second logic state by the eleventh transistor MP11 depending on the eleventh control signal Ctrl11. Afterwards, the enable signal EN may change to the first logic state by the first pulse VP1.

At a second transition time T5, the voltage VML2 of the second matching line ML2 may reach a threshold voltage Vth(SA) of the second sense amplifier 352. A logic state of the second amplified voltage VA2 may be changed at the second transition time T5. However, since the second pulse generator 365 does not operate depending on the enable signal EN being deactivated, the second pulse VP2 is not generated. Since the first pulse VP1 is generated and the second pulse VP2 is not generated, the first code Code1 may be changed to the second logic state, and the second code Code2 may be maintained at the first logic state.

Figure 7:
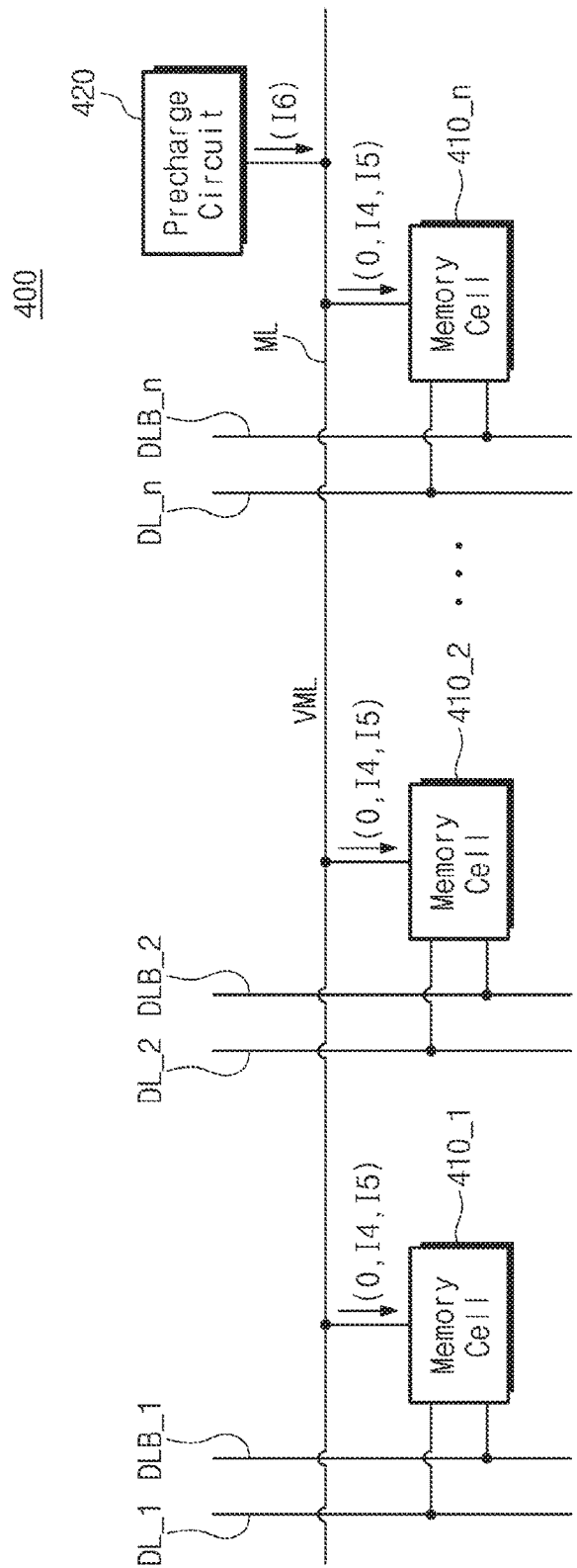
FIG. 7 is a block diagram illustrating a memory device according to an exemplary embodiment of the inventive concept.

FIG. 7 is a block diagram illustrating a memory device according to an exemplary embodiment of the inventive concept. Referring to FIG. 7, a memory device 400 may include a plurality of memory cells 410_1 to 410_n and a precharge circuit 420. Each of the plurality of memory cells 410_1 to 410_n may be implemented to be substantially the same as the memory cell 210 of FIG. 2. The precharge circuit may be implemented to be substantially the same as the second driving circuit 240 of FIG. 2.

The plurality of memory cells 410_1 to 410_n may be respectively connected with a plurality of data line pairs DL_1 and DLB_1 to DL_n and DLB_n. Unlike the first and second memory cells 310 and 315 of FIG. 4, the plurality of memory cells 410_1 to 410_n may not share the data line pairs DL_1 and DLB_1 to DL_n and DLB_n. The plurality of memory cells 410_1 to 410_n and the precharge circuit 420 may be connected to the matching line ML. In other words, the plurality of memory cells 410_1 to 410_n may share the matching line ML and the precharge circuit 420.

Unlike the memory cells 210, 310, and 315 of FIGS. 2 and 4, each of the plurality of memory cells 410_1 to 410_n may store first data including "n" bits (e.g., a multi-bit). For example, "n" may be a natural number of 2 or more such as 32, 64, 128, 256, or the like, and may indicate the size of the first data. The plurality of memory cells 410_1 to 410_n may drive the matching line ML to the first logic state depending on a result of comparing the first data and second data provided for search, or may not drive the matching line ML depending on the result of comparing. The second data may also include "n" bits.

The "n" bits of the first data may be stored in the plurality of memory cells 410_1 to 410_n, respectively. For a search operation, the "n" bits of the second data may be provided to the plurality of memory cells 410_1 to 410_n through the plurality of data line pairs DL_1 and DLB_1 to DL_n and DLB_n, respectively. In each of the plurality of memory cells 410_1 to 410_n, the corresponding bit of the second data may be compared with the corresponding bit of the first data.

The precharge circuit 420 may drive the matching line ML to the second logic state regardless of the comparison results of the plurality of memory cells 410_1 to 410_n. An operation of the precharge circuit 420 may be substantially the same as the operation of the second driving circuit 240 of FIG. 2.

Figure 8:
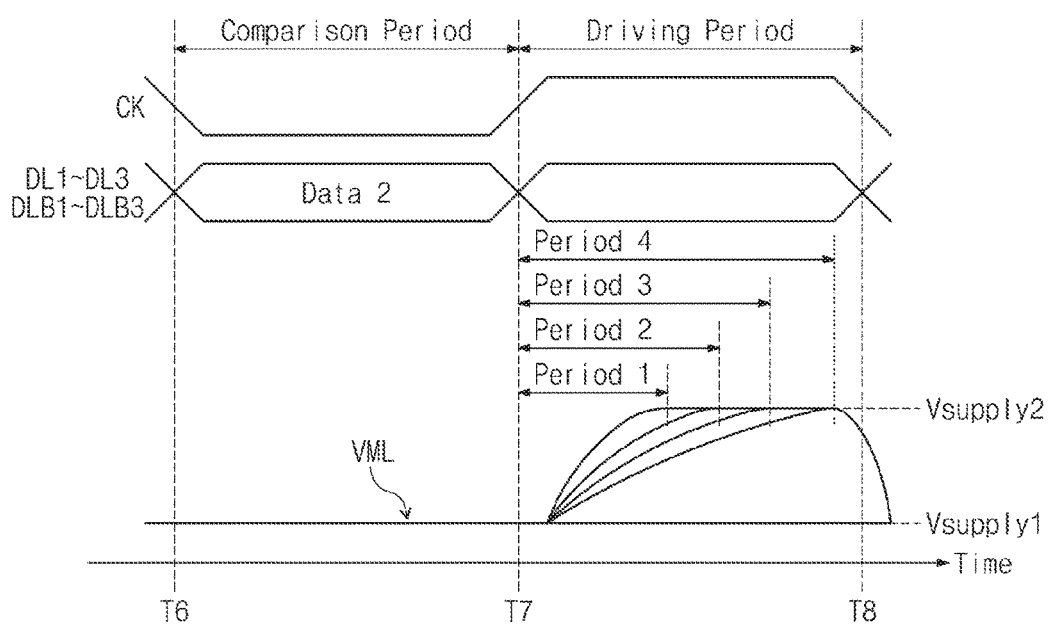
FIG. 8 is a timing diagram illustrating an operation of the memory device of FIG. 7 according to an exemplary embodiment of the inventive concept.

FIG. 8 is a timing diagram illustrating an operation of the memory device of FIG. 7 according to an exemplary embodiment of the inventive concept. FIG. 8 will be described with reference to FIGS. 3 and 7. In FIG. 8, it is assumed that "n" is 3.

An operation of the memory device 400 in a comparison period T6 to T7 is similar to the operation of the memory device 200 in the comparison period T1 to T2. Second data may be provided to the first to third memory cells 410_1 to 410_3 through the first to third data line pairs DL_1 and DLB_1 to DL_3 and DLB_3. The voltage VML of the matching line ML may be set to the first supply voltage Vsupply1 corresponding to the first logic state. To this end, the memory device 400 may further include an additional driving circuit or an additional precharge circuit that drives the matching line ML to the first logic state during the comparison period T6 to T7.

In the driving period T7 to T8, the matching line ML may be driven from the first logic state to the second logic state or may be maintained at the first logic state. The voltage VML of the matching line ML may change from the first supply voltage Vsupply1 to the second supply voltage Vsupply2, or may be maintained at the first supply voltage Vsupply1.

In an exemplary embodiment of the inventive concept, each of the 3 bits of the first data may not correspond to the don't care bit, and the first data may be matched with the second data. Each of the first to third memory cells 410_1 to 410_3 may not drive the matching line ML. For example, a current of each of the first to third memory cells 410_1 to 410_3 may be "0". The precharge circuit 420 may drive the matching line ML with the sixth current I6. The matching line ML may be driven from the first logic state to the second logic state by the precharge circuit 420 during a first period (Period 1). The voltage VML of the matching line ML may change from the first supply voltage Vsupply1 to the second supply voltage Vsupply2 during the first period.

In an exemplary embodiment of the inventive concept, one of 3 bits of the first data may correspond to the don't care bit, and the remaining bits thereof may be matched with corresponding bits of the second data, respectively. For example, the first memory cell 410_1 may store the don't care bit, and each of the second and third memory cells 410_2 and 410_3 may store a bit that is matched with the corresponding bit of the second data. In this case, the first memory cell 410_1 may drive the matching line ML with the fourth current I4. The second and third memory cells 410_2 and 410_3 may not drive the matching line ML, and a current of each of the second and third memory cells 410_2 and 410_3 may be "0".

The first memory cell 410_1 may drive the matching line ML with the fourth current I4, but the precharge circuit 420 may drive the matching line ML with the sixth current I6. Accordingly, the matching line ML may be driven from the first logic state to the second logic state by the precharge circuit 420 during a second period (Period 2). The voltage VML of the matching line ML may change from the first supply voltage Vsupply1 to the second supply voltage Vsupply2 during the second period. Due to the fourth current I4 of the first memory cell 410_1, the second period may be longer than the first period.

In an exemplary embodiment of the inventive concept, two of 3 bits of the first data may correspond to the don't care bit, and the remaining bit thereof may be matched with a corresponding bit of the second data. For example, each of the first and second memory cells 410_1 and 410_2 may store the don't care bit, and the third memory cell 410_3 may store a bit that is matched with the corresponding bit of the second data. In this case, each of the first and second memory cells 410_1 and 410_2 may drive the matching line ML with the fourth current I4. The third memory cell 410_3 may not drive the matching line ML, and a current of the third memory cell 410_3 may be "0".

Each of the first and second memory cells 410_1 and 410_2 may drive the matching line ML with the fourth current I4, but the precharge circuit 420 may drive the matching line ML with the sixth current I6. Accordingly, the matching line ML may be driven from the first logic state to the second logic state by the precharge circuit 420 during a third period (Period 3). The voltage VML of the matching line ML may change from the first supply voltage Vsupply1 to the second supply voltage Vsupply2 during the third period. Due to the fourth current I4 of each of the first and second memory cells 410_1 and 410_2, the third period may be longer than the first and second periods.

In an exemplary embodiment of the inventive concept, all 3 bits of the first data may correspond to the don't care bit. For example, each of the first to third memory cells 410_1 to 410_3 may store the don't care bit. In this case, each of the first to third memory cells 410_1 to 410_3 may drive the matching line ML with the fourth current I4.

Each of the first to third memory cells 410_1 to 410_3 may drive the matching line ML with the fourth current I4, but the precharge circuit 420 may drive the matching line ML with the sixth current I6. Accordingly, the matching line ML may be driven from the first logic state to the second logic state by the precharge circuit 420 during a fourth period (Period 4). The voltage VML of the matching line ML may change from the first supply voltage Vsupply1 to the second supply voltage Vsupply2 during the fourth period. Due to the fourth current I4 of each of the first to third memory cells 410_1 to 410_3, the fourth period may be longer than the first to third periods.

In the above-described exemplary embodiments, the matching line ML may be driven from the first logic state to the second logic state. However, a time or a slope where the matching line ML is driven from the first logic state to the second logic state may change with the number of don't care bits. In the case where the first data is matched with the second data, the memory device 400 may drive the matching line ML depending on a priority that is determined by the number of don't care bits.

As another example, the first data may be mismatched with the second data. In detail, at least one of 3 bits of the first data may be mismatched with a corresponding bit of the second data. For example, the first memory cell 410_1 (or one of the first to third memory cells 410_1 to 410_3) may store a bit that is mismatched with a corresponding bit of the second data. In this case, the first memory cell 410_1 may drive the matching line ML with the fifth current I5 or may maintain the first logic state of the matching line ML.

Figure 9:
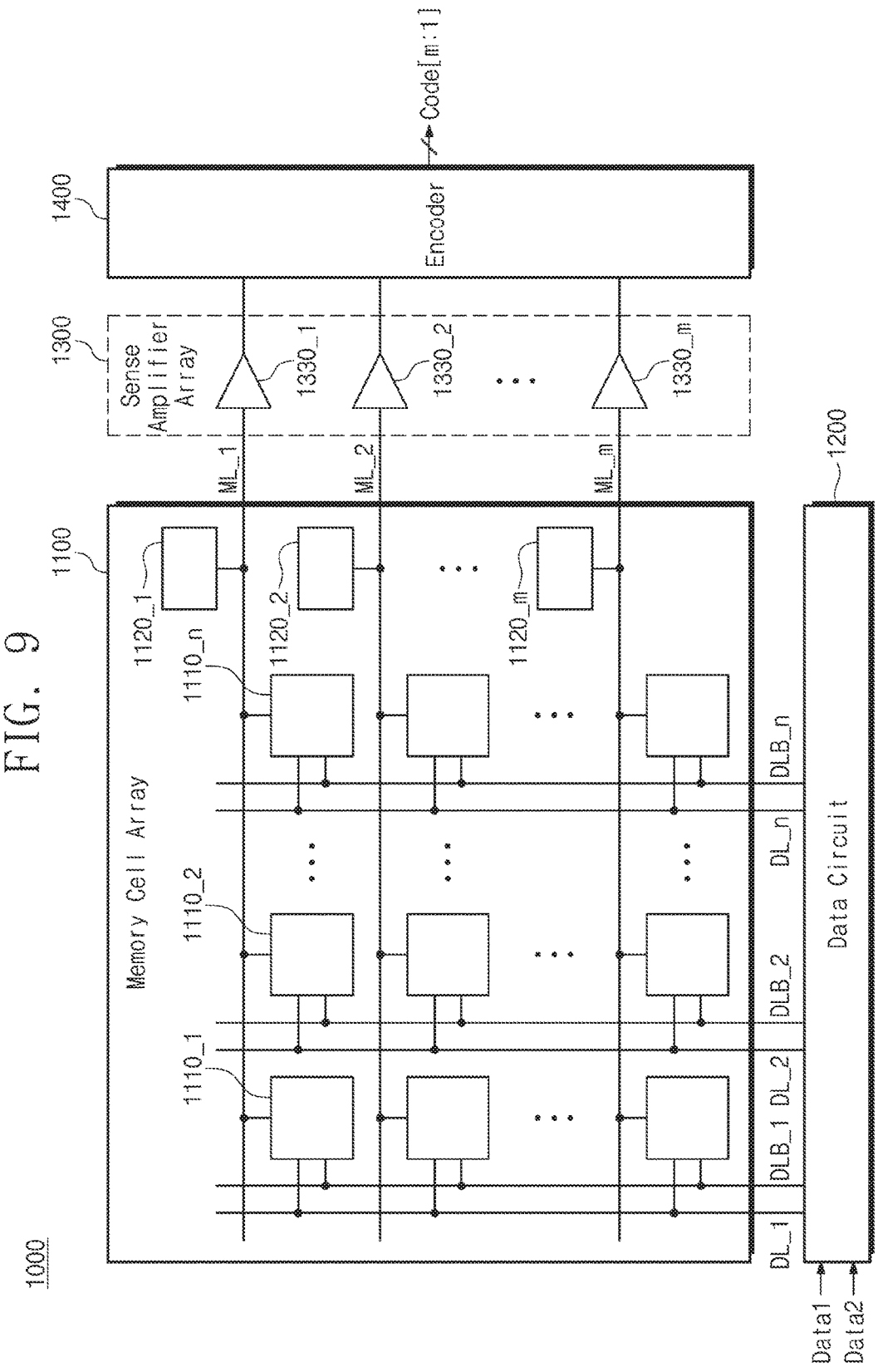
FIG. 9 is a block diagram illustrating a memory device according to an exemplary embodiment of the inventive concept.

FIG. 9 is a block diagram illustrating a memory device according to an exemplary embodiment of the inventive concept. FIG. 9 will be described with reference to FIGS. 2, 4, and 7. Referring to FIG. 9, a memory device 1000 may include a memory cell array 1100, a data circuit 1200, a sense amplifier array 1300, and an encoder 1400.

The memory cell array 110 may include a plurality of memory cells arranged at intersections of a plurality of data line pairs DL_1 and DLB_1 to DL_n and DLB_n and a plurality of matching lines ML_1 to ML_m. For example, "m" and "n" are natural numbers. Operations of the plurality of memory cells may be substantially the same as described with reference to FIGS. 2, 4, and 7. The memory cell array may include a plurality of precharge circuits 1120_1 to 1120_m that drive the plurality of matching lines ML_1 to ML_m. Operations of the plurality of precharge circuits 1120_1 to 1120_m may be substantially the same as described with reference to FIGS. 4 and 7.

The data circuit 1200 may provide first data or second data to the memory cell array 1100 through the plurality of data line pairs DL_1 and DLB_1 to DL_n and DLB_n. The first data may be data stored in the memory cell array 1100. The second data may be data provided to the memory cell array 1100 for search. Each of the first data and the second data may include "n" bits.

The data circuit 1200 may provide the first data including "n" bits to first to n-th memory cells 1110_1 to 1110_n connected to a first matching line ML_1. Similar to the above description, the data circuit 1200 may provide the first data including "n" bits to "n" memory cells connected to a second matching line ML_2. Here, the first data stored in the memory cells connected to the first matching line ML_1 may be different from the first data stored in the memory cells connected to the second matching line ML_2.

The sense amplifier array 1300 may include a plurality of sense amplifiers 1330_1 to 1330_m. An operation of the sense amplifier array 1300 may be substantially the same as the operation of the sense amplifier array 350 of FIG. 4.

The encoder 1400 may output an address of one matching line, which is connected with a plurality of memory cells storing the most matched with the second data, from among the plurality of matching lines ML_1 to ML_m. Codes Code[m:1] may indicate which matching line is selected. An operation of the encoder 1400 may be substantially the same as the operation of the encoder 360 of FIG. 4.

According to an exemplary embodiment of the inventive concept, the memory cell array 1100 may change logic states of matching lines that are connected to memory cells having first data matched with second data. Transition times when logic states are changed may be determined according to the number of don't care bits of the first data. For example, a transition time may become faster as the number of don't care bits decreases. Accordingly, the encoder 1400 may output an address of a matching line corresponding to first data that are the most matched with second data, depending on transition times when logic states of matching lines are changed. Thus, the encoder 1400 may not include a circuit to count the number of don't care bits and a priority algorithm for selecting one of the matching lines. Accordingly, the area, power consumption, and operating time of the encoder 1400 may decrease.

Figure 10:
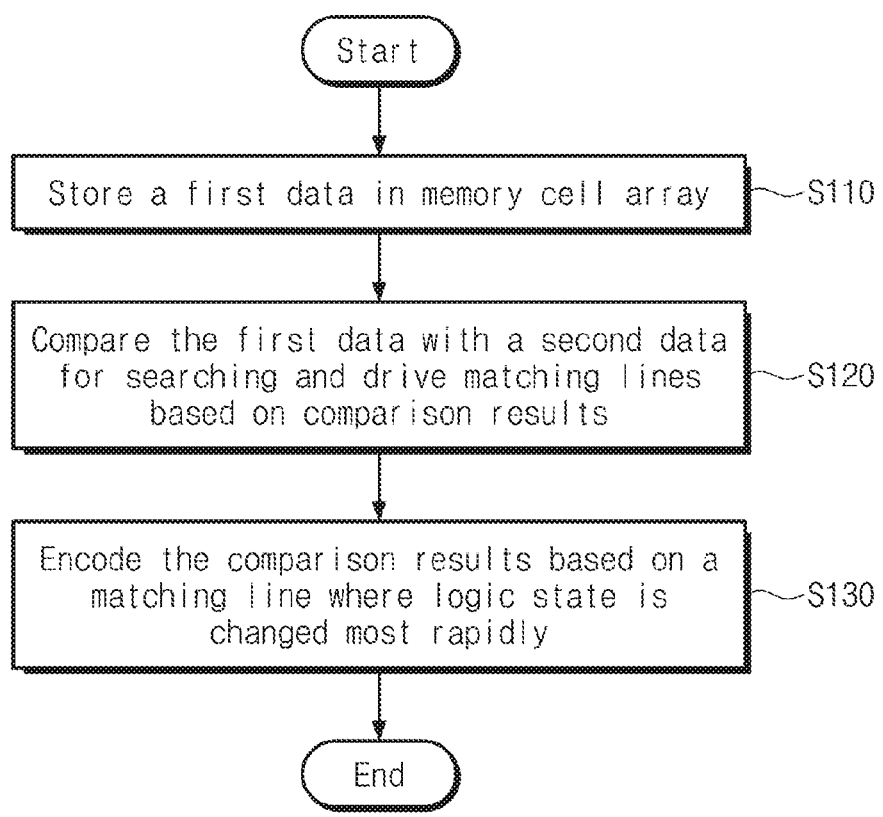
FIG. 10 is a flowchart illustrating an operation of the memory device of FIG. 9 according to an exemplary embodiment of the inventive concept.

FIG. 10 is a flowchart illustrating an operation of the memory device of FIG. 9 according to an exemplary embodiment of the inventive concept.

In operation S110, the memory device 1000 may store first data in the memory cell array 1100. In detail, the first data stored in the memory cells connected to the first matching line ML_1 may be different from the first data stored in the memory cells connected to the second matching line ML_2.

In operation S120, the memory cell array 1100 may compare the first data and second data for search. A comparison operation may be performed on all memory cells of the memory cell array 1100. The memory cell array 1100 may drive the plurality matching lines ML_1 to ML_m based on the comparison results.

In operation S130, the encoder 1400 may encode the comparison results based on a matching line, the logic state of which is changed most rapidly. First data of memory cells connected with the matching line, the logic state of which is changed most rapidly, may be the most matched with the second data.

Figure 11:
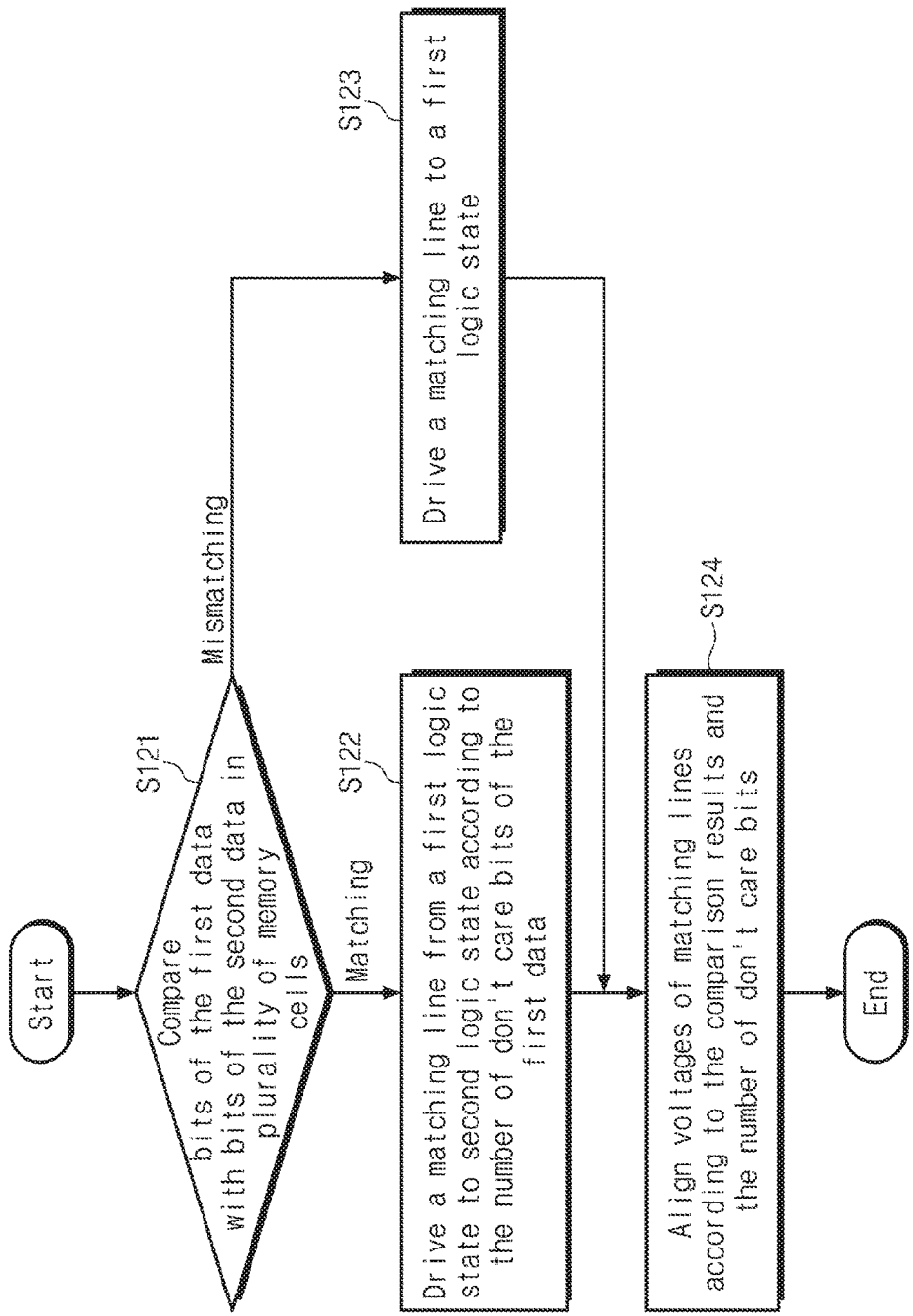
FIG. 11 is a flowchart illustrating a comparison operation of the operation of FIG. 10 according to an exemplary embodiment of the inventive concept.

FIG. 11 is a flowchart illustrating a comparison operation of the operation of FIG. 10 according to an exemplary embodiment of the inventive concept. In particular, FIG. 11 illustrates operation S120 in detail.

In operation S121, the memory cell array 1100 may compare bits of first data and bits of second data in a plurality of memory cells. If the first data are matched with the second data, operation S122 is performed. If the first data are mismatched with the second data, operation S123 is performed.

In operation S122, the memory cell array 1100 may drive a matching line from the first logic state to the second logic state depending on the number of don't care bits of the first data. Since one or more don't care bits are included in the first data, the memory cell array 1100 may drive a matching line depending on a priority that is based on the number of don't care bits. For example a priority of the corresponding matching line may become higher as the number of don't care bits decreases.

In operation S123, the memory cell array 1100 may drive a matching line, which is connected with memory cells having first data mismatched with the second data, to the first logic state. A logic state of the matching line of operation S122 is different from a logic state of the matching line of operation S123.

In operation S124, voltages of matching lines may be aligned according to the comparison results of operation S121 and the number of don't care bits. Afterwards, voltages of the matching lines may be provided to the encoder 1400 through the sense amplifier array 1300.

Figure 12:
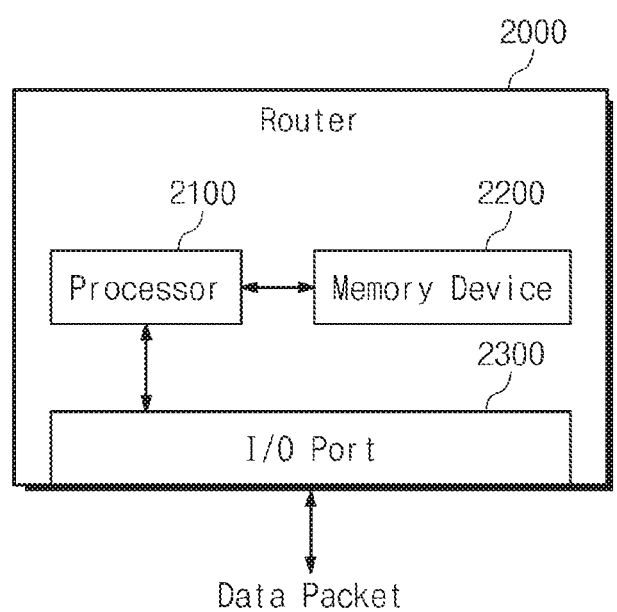
FIG. 12 is a block diagram illustrating a router including a memory device according to an exemplary embodiment of the inventive concept.

FIG. 12 is a block diagram illustrating a router including a memory device according to an exemplary embodiment of the inventive concept. Referring to FIG. 12, a router 2000 may include a processor 2100, a memory device 2200, and an input/output port 2300.

The router 2000 may be an Internet networking device for connection between networks (e.g., a local area network (LAN) and a wide area network (WAN)). The router 2000 may exchange data packets with a communication device (e.g., another router, a computing device, or the like).

The processor 2100 may perform overall operations of the router 2000. The processor 2100 may process a data packet provided through the input/output port 2300. The processor 2100 may include controllers for controlling components of the router 2000, graphics engines, interfaces, or the like. The processor 2100 may be provided in the form of a system-on-chip (SoC) or an application specific integrated circuit (ASIC).

The memory device 2200 may store pieces of information needed for the processor 2100 to process data packets. For example, the memory device 2200 may store IP addresses. The processor 2100 may search the memory device 2200 for an IP address matched with information included in the received data packet. The processor 2100 may record the found IP address in the data packet and may transmit the recorded result to the corresponding port. For example, the memory device 2200 may include one of the memory devices 100, 200, 300, 400, and 1000 described with reference to FIGS. 1 to 11.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device comprising:
   a storage circuit configured to store first data and to compare the first data and second data;
   a first driving circuit configured to selectively drive a matching line to a first logic state only or not drive the matching line depending on a comparison result of the first data and the second data by the storage circuit; and
   a second driving circuit configured to drive the matching line to a second logic state regardless of the comparison result.

2. The memory device of claim 1, wherein, if the first data do not correspond to a don't care bit and are matched with the second data, the matching line is driven from the first logic state to the second logic state during a first period,
   wherein, if the first data correspond to the don't care bit, the matching line is driven from the first logic state to the second logic state during a second period longer than the first period, and
   wherein, if the first data are mismatched with the second data, the matching line is driven to the first logic state by the first driving circuit.

3. The memory device of claim 2, wherein, if the first data do not correspond to the don't care bit and are matched with the second data, the first driving circuit does not drive the matching line and the second driving circuit drives the matching line, and
   wherein, if the first data correspond to the don't care bit or the first data are mismatched with the second data, both the first driving circuit and the second driving circuit drive the matching line.

4. The memory device of claim 1, wherein the storage circuit comprises at least one resistive memory element that is programmed according to the first data.

5. The memory device of claim 4, wherein the storage circuit is further configured to:
   output a first voltage or a first current if the first data do not correspond to a don't care bit and the first data are matched with the second data,
   output a second voltage or a second current if the first data correspond to the don't care bit, and
   output a third voltage or a third current if the first data are mismatched with the second data.

6. The memory device of claim 5, wherein the first driving circuit comprises:
   a first transistor configured to receive the first to third voltages, or the first to third currents; and
   a second transistor configured to drive the matching line to the first logic state depending on an output of the first transistor.

7. The memory device of claim 6, wherein, if the first transistor receives the first voltage or the first current, the second transistor is turned off,
   wherein, if the first transistor receives the second voltage or the second current, the second transistor is turned on and drives the matching line with a fourth current, and
   wherein, if the first transistor receives the third voltage or the third current, the second transistor is turned on and drives the matching line with a fifth current greater than the fourth current.

8. The memory device of claim 7, wherein the first driving circuit further comprises:
   a third transistor connected with a gate of the second transistor to adjust the fourth current and the fifth current.

9. A memory device comprising:
   a first memory cell configured to store first data and to drive a first matching line depending on a first comparison result of the first data and third data;
   a second memory cell configured to store second data and to drive a second matching line depending on a second comparison result of the second data and the third data;
   a sense amplifier array configured to amplify a voltage of the first matching line to output a first amplified voltage and to amplify a voltage of the second matching line to output a second amplified voltage; and
   an encoder configured to output one of addresses of the first and second matching lines depending on a first transition time of the first amplified voltage or a second transition time of the second amplified voltage.

10. The memory device of claim 9, wherein the first memory cell and the second memory cell are connected to a data line and receive the third data through the data line.

11. The memory device of claim 10, further comprising:
    a first precharge circuit configured to drive the first matching line regardless of the first comparison result; and
    a second precharge circuit configured to drive the second matching line regardless of the second comparison result.

12. The memory device of claim 11, wherein, if the first data do not correspond to a don't care bit and are matched with the third data or if the first data correspond to the don't care bit, the first precharge circuit and the sense amplifier array change a logic state of the first amplified voltage, and
    wherein, if the second data do not correspond to the don't care bit and are matched with the third data or if the second data correspond to the don't care bit, the second precharge circuit and the sense amplifier array change a logic state of the second amplified voltage.

13. The memory device of claim 12, wherein, if the first data are mismatched with the third data, the first memory cell and the sense amplifier array do not change the logic state of the first amplified voltage, and
    wherein, if the second data are mismatched with the third data, the second memory cell and the sense amplifier array do not change the logic state of the second amplified voltage.

14. The memory device of claim 13, wherein, if the logic state of the first amplified voltage is changed and the logic state of the second amplified voltage is not changed, the encoder outputs an address of the first matching line.

15. The memory device of claim 13, wherein the first transition time precedes the second transition time, and
 wherein, if the logic state of the first amplified voltage is changed at the first transition time and the logic state of the second amplified voltage is changed at the second transition time, the encoder outputs an address of the first matching line.

16. A memory device comprising:
 a plurality of memory cells configured to store first data and to selectively drive a matching line to a first logic state only or not drive the matching line, depending on a comparison result of the first data and second data; and
 a precharge circuit configured to drive the matching line to a second logic state regardless of the comparison result,
 wherein each of the plurality of memory cells and the precharge circuit are connected to the matching line.

17. The memory device of claim 16, wherein the plurality of memory cells are connected to a plurality of data lines and configured to receive a plurality of bits of the second data through the plurality of data lines.

18. The memory device of claim 16, wherein a plurality of bits of the first data are stored in the plurality of memory cells,
 wherein, if each of the plurality of bits of the first data does not correspond to a don't care bit and the first data are matched with the second data, the matching line is driven from the first logic state to the second logic state during a first period,
 wherein, if at least one of the plurality of bits of the first data corresponds to the don't care bit and the remaining bits of the plurality of bits of the first data are respectively matched with corresponding bits of the second data, the matching line is driven from the first logic state to the second logic state during a second period longer than the first period, and
 wherein, if the first data are mismatched with the second data, the matching line is driven to the first logic state.

19. The memory device of claim 18, wherein each of the plurality of memory cells comprises at least one resistive memory element that is programmed according to the first data.

20. The memory device of claim 18, wherein, if the first data are mismatched with the second data, at least one of the plurality of memory cells drives the matching line to the first logic state.

* * * * *